US006995607B2

(12) United States Patent
Dosho et al.

(10) Patent No.: US 6,995,607 B2
(45) Date of Patent: Feb. 7, 2006

(54) LOW-PASS FILTER AND FEEDBACK SYSTEM

(75) Inventors: Shiro Dosho, Osaka (JP); Takashi Morie, Osaka (JP); Kazuaki Sogawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1 day.

(21) Appl. No.: 10/799,716

(22) Filed: Mar. 15, 2004

(65) Prior Publication Data

US 2004/0263261 A1  Dec. 30, 2004

(30) Foreign Application Priority Data

Jun. 27, 2003  (JP)  ............................. 2003-185573

(51) Int. Cl.
*H03K 5/00* (2006.01)
(52) U.S. Cl. ..................... 327/558; 327/157; 331/17
(58) Field of Classification Search ............ 331/16–17, 331/25, 66; 327/156–157, 552–559, 311
See application file for complete search history.

(56) References Cited

U.S. PATENT DOCUMENTS

| | | | |
|---|---|---|---|
| 5,150,324 A * | 9/1992 | Takasuka et al. ............ 708/801 |
| 5,180,993 A * | 1/1993 | Dent ........................... 331/16 |
| 5,332,930 A | 7/1994 | Volk | |
| 5,374,904 A * | 12/1994 | Ishibashi .................... 331/17 |
| 5,592,120 A | 1/1997 | Palmer et al. | |
| 5,774,023 A * | 6/1998 | Irwin ......................... 331/17 |
| 6,344,772 B1 | 2/2002 | Larsson | |
| 6,417,739 B1 * | 7/2002 | Chacko ...................... 331/17 |
| 6,546,059 B1 | 4/2003 | Knoll et al. | |
| 6,642,747 B1 * | 11/2003 | Chiu .......................... 327/40 |
| 2004/0101081 A1 * | 5/2004 | Hsu ........................... 327/157 |

FOREIGN PATENT DOCUMENTS

| | | |
|---|---|---|
| EP | 1 282 234 A1 | 2/2003 |
| JP | 56-119520 | 9/1981 |
| JP | 27-78421 | 5/1998 |
| JP | 2003-121647 | 4/2003 |
| WO | WO 03/098807 A1 | 11/2003 |

OTHER PUBLICATIONS

Toyama, Masaomi., et al. "A Design of a Compact 2GHz-PLL with New Adaptive Active Loop Filter Circuit." 2003 Symposium on VLSI Circuits Digest if Technical Papers, Kyoto, Japan, Jun. 12-14, 2003, pp. 185-188.

* cited by examiner

*Primary Examiner*—Dinh T. Le
(74) *Attorney, Agent, or Firm*—McDermott Will & Emery LLP

(57) ABSTRACT

In a low-pass filter, the filter characteristics equivalent to those of a conventional low-pass filter are maintained, the size of a capacitive element is decreased, and the low-pass filter operates stably. Further, a MOS capacitor is used as a capacitive element. For such purposes, in a low-pass filter including a first capacitive element, and a resistive element and a second capacitive element which are connected in series to the first capacitive element, a first electric current is supplied to the first input terminal connected to one end of the first capacitive element, and a second electric current is supplied to the second input terminal connected to the other end of the first capacitive element. Herein, the capacitance value of the first capacitive element is set according to the magnitude of the first electric current. Further, the resistive element is provided with a power supply that is connected in series to the resistive element, and a voltage equal to or higher than the threshold voltage of a MOS transistor is always applied between the second input terminal and the ground.

6 Claims, 14 Drawing Sheets

(a)

(b)

(c)

LSI device incorporating
PLL or DLL of the present
invention

Application to IC card

COC component
incorporating PLL or DLL
of the present invention

Base material to
which COC component
is attached

Application to COC component

Installation in LSI pad

Installation in MPU clock

LOW-PASS FILTER AND FEEDBACK SYSTEM

BACKGROUND OF THE INVENTION

The present invention relates to a low-pass filter and specifically to a technique of a low-pass filter suitable for use as a loop filter in a feedback system, such as a phase locked loop circuit, a delay locked loop, or the like.

In currently-existing semiconductor integrated circuit systems, a feedback system, especially a phase locked loop circuit (hereinafter, referred to as "PLL"), is one of the indispensable components and is incorporated in almost all the LSI devices. The applications of the feedback system range over various technological fields, such as communication devices, microprocessors, IC cards, etc.

FIG. 14 shows the structure of a general charge pump type PLL. General features of the PLL are described with reference to FIG. 14. A phase comparator 10 compares input clock CKin which is supplied to the PLL and feed back clock CKdiv and outputs up signal UP and down signal DN according to the phase difference between the compared clocks. A charge pump circuit 20 outputs (releases or sucks) electric current Ip based on up signal UP and down signal DN. A loop filter 30 smoothes electric current Ip and outputs voltage Vout as a result of the smoothing of electric current Ip. A voltage controlled oscillator 40 changes the frequency of output clock CKout of the PLL based on voltage Vout. A frequency divider 50 divides output clock CKout by N, and a resultant clock is fed back as feedback clock CKdiv to the phase comparator 10. By repeating the above operation, output clock CKout gradually converges on a predetermined frequency and is locked.

The loop filter 30 is an especially significant component among the above components of the PLL. It can be said that the response characteristic of the PLL is determined according to the filter characteristics of the loop filter 30.

FIGS. 15A and 15B show general loop filters. FIG. 15A shows a passive filter. FIG. 15B shows an active filter. These filters are equivalently replaceable with each other and have the same transfer characteristic. As seen from FIGS. 15A and 15B, the loop filter 30 is substantially a low-pass filter formed by a combination of a resistive element and a capacitive element irrespective of whether it is a passive filter or an active filter.

According to the control theory for PLLs, the response bandwidth of the PLL is preferably about a $\frac{1}{10}$ of the frequency of the input clock at the maximum. If this theory is followed, in a PLL which receives a reference clock having a relatively low frequency, it is necessary to reduce the cutoff frequency of the loop filter such that the response bandwidth is narrowed. Thus, a loop filter in a conventional PLL has a relatively large time constant, i.e., a large CR product. In general, a larger capacitive element is used in order to achieve a larger CR product.

However, increasing the size of the capacitive element causes an increase in the circuit size. This is a serious problem especially in a semiconductor integrated circuit including a large number of PLLs, such as a microprocessor, or the like. Further, especially in an IC card, it should be avoided, in view of reliability, to incorporate an element thicker than the card. The countermeasure of externally providing a large capacitive element is substantially impossible. Conventionally, the following means have been provided for the purpose of decreasing the size of the capacitive element of the loop filter.

In the first countermeasure example, a loop filter is structured such that a capacitive element and a resistive element, which would generally be connected in series, are separated, and separate electric currents are supplied to these elements. The voltages generated in the elements are added together in an adder circuit, and a resultant voltage is output from the adder circuit (see, for example, the specification of Japanese Patent No. 2778421 (page 3 and FIG. 1)). According to this loop filter, the electric current supplied to the capacitive element is smaller than that supplied to the resistive element, whereby the filter characteristics equivalent to those of a conventional filter are maintained, and the size of the capacitive element is relatively decreased.

The second countermeasure example is a loop filter disclosed in a patent application by the first inventor of the present application (Japanese Patent Application No 2003-121647: hereinafter, referred to as "prior application"). FIG. 16 shows an example of the loop filter disclosed in the prior application. This loop filter receives two lines of electric currents which are obtained by interiorly dividing electric current Ip with a predetermined ratio. Specifically, the loop filter receives electric current Ip/10 and electric current 9Ip/10 at input terminals IN1 and IN2, respectively. Then, the voltage generated between the capacitive element 31 and the resistive element 32 is output. With such a structure, the size of the capacitive element 31 is largely reduced while maintaining the transfer characteristic equivalent to that of the passive filter shown in FIG. 15A.

However, in the first example, it is necessary to provide the adder circuit even when a passive loop filter is structured. Accordingly, the circuit area increases, and the complexity of the circuit also increases. In the second example, the adder circuit is not necessary, and therefore, none of the circuit area and the circuit complexity increases. However, the potential at input terminal IN2 becomes very close to the ground potential, which may cause various problems.

If the potential at input terminal IN2 becomes close to the ground potential, a MOS transistor (not shown) for controlling the supply/stop of the electric current flowing into input terminal IN2 does not stably operate. As a result, it becomes impossible to precisely supply a constant current to input terminal IN2, and there is a possibility that the operation of the low-pass filter becomes unstable.

Furthermore, when the potential at input terminal IN2 becomes close to the ground potential, the voltage applied between the ends of the capacitive element 33 becomes extremely small, and therefore, it becomes difficult to use a MOS capacitor for the capacitive element 33. If a voltage equal to or higher than a threshold voltage is not applied to the MOS capacitor, the capacitance value of the MOS capacitor decreases, and the MOS capacitor may not function as a capacitor.

Today, a PLL is frequently used in various digital circuits, but in many cases, a manufacturing process of a digital circuit does not include a capacitor process. Thus, under the restriction that a capacitive element cannot be externally provided, a capacitive element in a loop filter of a PLL is structured using a MOS capacitor. However, as described above, in the case of a loop filter disclosed in the prior application, it is difficult to use the MOS capacitor for the capacitive element 33. Thus, the capacitive element 33 is formed by using, for example, a capacitance between wires, or the like, which causes an increase in the circuit area.

SUMMARY OF THE INVENTION

In view of the above problems, an objective of the present invention is to provide a low-pass filter which has filter characteristics equivalent to those of a conventional low-pass filter, which has a small-sized capacitive element, and which operates stably. Another objective of the present invention is to construct such a low-pass filter using a MOS capacitor. Still another objective of the present invention is to provide a feedback system including such a low-pass filter as a loop filter.

The first measure taken by the present invention for achieving the above objectives is a low-pass filter comprising: a first element block having a first capacitive element; a second element block having a resistive element and a power supply connected in series to the resistive element, one end of the second element block being connected to one end of the first element block, the other end of the second element block being supplied with a reference voltage; a third element block having a second capacitive element, the third element block being connected in parallel to the second element block; a first input terminal for receiving a first electric current, the first input terminal being connected to the other end of the first element block; and a second input terminal for receiving a second electric current, the second input terminal being connected to a connection point of the first to third element blocks, the direction of the second electric current being the same as that of the first electric current, the magnitude of the second electric current being N times that of the first electric current (where N is a predetermined number), wherein the low-pass filter outputs a voltage generated at the one end of the first element block.

With such a structure, the electric current flowing through the first element block is smaller than the electric currents flowing through the second and third element blocks. That is, the second electric current which is received at the second input terminal is merged into the electric current flowing through the first element block, and the resultant electric current flows through the second and third element blocks. Thus, only the size of the capacitive element of the first element block is relatively decreased without increasing the resistance value of a resistive element in the second element block. Furthermore, the second element block is provided with a power supply, whereby the voltage applied to the second input terminal is always equal to or higher than the supply voltage of the power supply. Thus, a MOS transistor which controls the supply/stop of an electric current to the second input terminal stably operates, and a constant electric current is accurately supplied to the second input terminal. Further, the voltage applied between the ends of the second capacitive element is secured, and a MOS capacitor is readily used.

The second measure taken by the present invention is a low-pass filter comprising: a first element block having a first capacitive element, one end of the first element block being supplied with a first voltage; a second element block having a voltage buffer circuit which receives a voltage generated at the other end of the first element block and a resistive element which is connected in series to the output side of the voltage buffer circuit, one end of the second element block being connected to the other end of the first element block; a third element block having a second capacitive element, one end of the third element block being connected to the other end of the second element block, the other end of the third element block being supplied with a second voltage; a first input terminal for receiving a first electric current, the first input terminal being connected to the other end of the first element block; and a second input terminal for receiving a second electric current, the second input terminal being connected to a connection point of the second and third element blocks, the magnitude of the second electric current being N times that of the first electric current (where N is a predetermined number), wherein the low-pass filter outputs a voltage generated at a connection point of the second and third element blocks.

With such a structure, the sum of the voltages generated in the first and second element blocks is output while series connection of the first element block and the second and third element blocks is avoided. Further, it is not necessary to provide an adder circuit for summing the voltages. That is, the voltages at the first and second input terminals are maintained at a relatively high level, and the first and second electric currents are stably received at the first and second input terminals, respectively. Furthermore, the voltages applied to the first and third element blocks are secured, whereby MOS capacitors are readily used for the first and second capacitive elements.

The third measure taken by the present invention is a low-pass filter comprising: a first element block having a first capacitive element, one end of the first element block being supplied with a first voltage; a second element block having a resistive element and a power supply connected in series to the resistive element, one end of the second element block being supplied with a second voltage; a third element block having a second capacitive element, the third element block being connected in parallel to the second element block; a first voltage-current conversion circuit for converting a voltage generated at the other end of the first element block to an electric current; a second voltage-current conversion circuit for converting a voltage generated at the other end of the second element block to an electric current; a first input terminal for receiving a first electric current, the first input terminal being connected to the other end of the first element block; and a second input terminal for receiving a second electric current, the second input terminal being connected to a connection point of the second and third element blocks, the magnitude of the second electric current being N times that of the first electric current (where N is a predetermined number), wherein the low-pass filter outputs the sum of the electric currents generated by the first and second voltage-current conversion circuits.

With such a structure, the sum of electric currents that are determined according to the voltages generated in the first and second element blocks is output while series connection of the first element block and the second and third element blocks is avoided. Therefore, it is not necessary to provide an adder circuit. That is, the voltages at the first and second input terminals are maintained at a relatively high level, and the first and second electric currents are stably received at the first and second input terminals, respectively. Furthermore, the voltages applied to the first and third element blocks are secured, whereby MOS capacitors are readily used for the first and second capacitive elements.

Preferably, the resistive element of the second element block is an internal resistor of the power supply. Alternatively, the resistive element of the second element block is preferably an internal resistor of the voltage buffer circuit.

Preferably, the resistive element of the second element block is a switched-capacitor circuit.

In the low-pass filters of the above-described second and third measures, both the first and second capacitive elements are preferably MOS capacitors.

Another measure taken by the present invention is a feedback system for feeding back an output clock generated based on an input clock such that the output clock has a predetermined characteristic, comprising: a loop filter formed by any of the above low-pass filters; a charge pump circuit for generating the first and second electric currents which are to be input to the loop filter based on a phase difference between the input clock and the fed-back clock; and output clock generation means for generating the output clock based on an output signal from the loop filter.

Thus, a small-sized feedback loop is realized while the loop characteristics are maintained so as to be equivalent to those of a conventional feedback loop.

DESCRIPTION OF THE PREFERRED EMBODIMENTS

Hereinafter, embodiments of the present invention are described with reference to the drawings.

(Embodiment 1)

Figure 1:
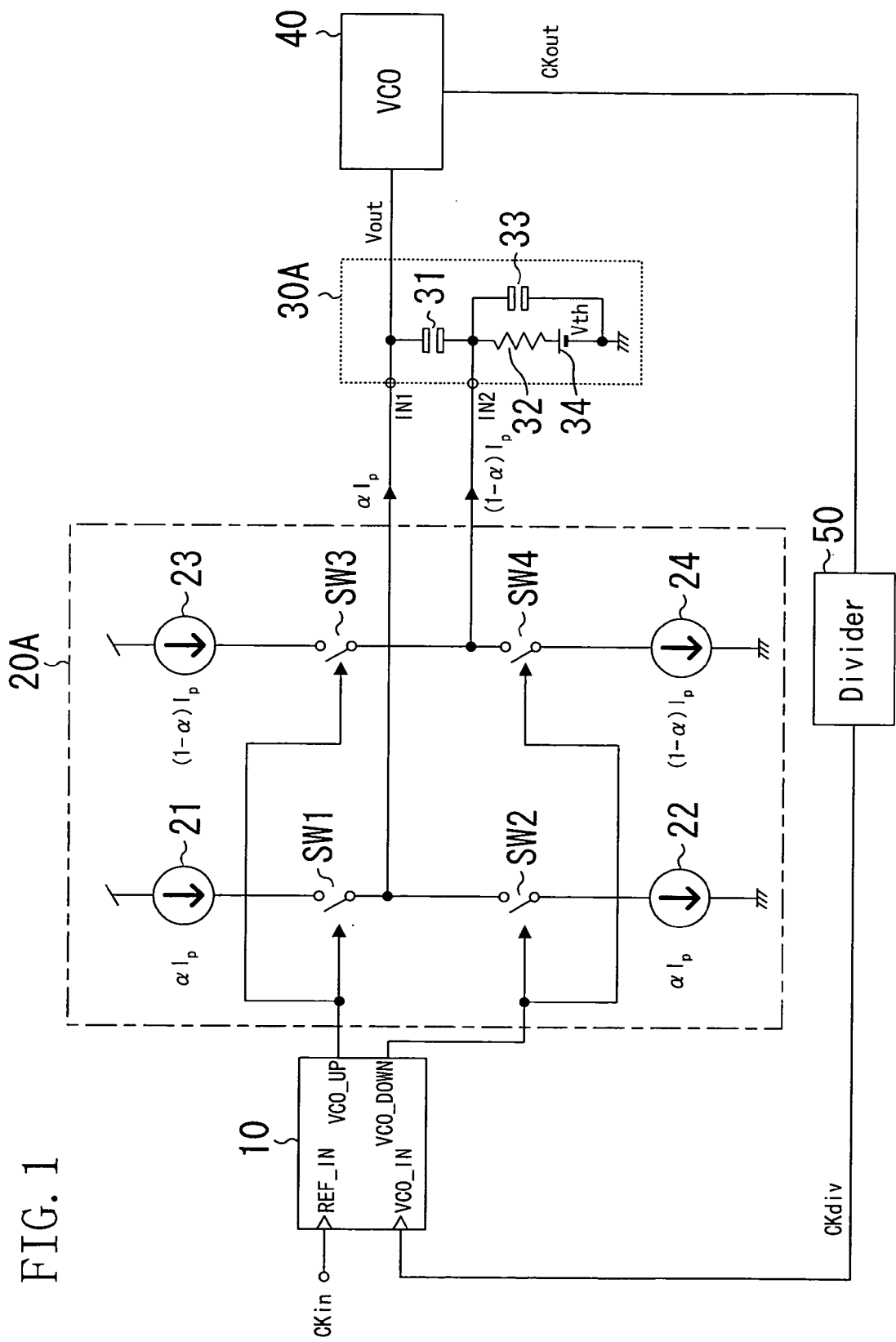
FIG. 1 shows the structure of a feedback system according to embodiment 1 of the present invention.

FIG. 1 shows the structure of a feedback system according to embodiment 1 of the present invention. The feedback system of embodiment 1 is a PLL including a phase comparator 10, a charge pump circuit 20A, a loop filter 30A, a voltage controlled oscillator (output clock generation means) 40, and a frequency divider 50. Among these components, the phase comparator 10, the voltage controlled oscillator 40, and the frequency divider 50 are the same as those described above. Hereinafter, the charge pump circuit 20A and the loop filter 30A are described in detail.

The charge pump circuit 20A includes current sources 21 and 23 for charge, which supply electric currents $\alpha Ip$ and $(1-\alpha)Ip$, respectively, and current sources 22 and 24 for discharge. When signal UP is supplied, control switches SW1 and SW3 are brought into conduction so that electric currents $\alpha Ip$ and $(1-\alpha)Ip$ are released. On the other hand, when signal DN is supplied, control switches SW2 and SW4 are brought into conduction so that electric currents $\alpha Ip$ and $(1-\alpha)Ip$ are sucked. That is, two lines of electric currents, which are obtained by interiorly dividing electric current Ip with the ratio of $\alpha:(1-\alpha)$, are output from/input to the charge pump circuit 20A.

Electric currents $\alpha Ip$ and $(1-\alpha)Ip$ output from/input to the charge pump circuit 20A are input to the loop filter 30A at input terminals IN1 and IN2, respectively. In the loop filter 30A, a capacitive element 31 is provided as the first element block between input terminal IN1 and input terminal IN2. Further, between input terminal IN2 and the reference voltage, there are a resistive element 32 and a power supply 34, which are connected in series and constitute the second element block, and a capacitive element 33 which is connected in parallel to the second element block and constitutes the third element block. The loop filter 30A outputs voltage Vout of input terminal IN1, i.e., a voltage generated at one end of the capacitive element 31.

In the loop filter 30A, electric current $\alpha Ip$ supplied at input terminal IN1 flows through the capacitive element 31, and the resistive element 32 and the capacitive element 33 which are connected in parallel. Electric current $(1-\alpha)Ip$ is supplied at input terminal IN2 in the same direction as that of electric current $\alpha Ip$ and flows through the resistive element 32 and the capacitive element 33 which are connected in parallel. Thus, only a part of the electric current flowing through the resistive element 32 and the capacitive element 33, which are connected in parallel, is allowed to flow through the capacitive element 31. Accordingly, the static capacitance of the capacitive element 31 may be relatively small. The voltage generated between a down-sized version of the capacitive element 31 and the resistive element 32 is equal to the voltage generated when electric current Ip is supplied at input terminal IN1 in the structure where input terminal IN2 is not provided, and the size of the capacitive element 31 is not decreased.

Figure 2:
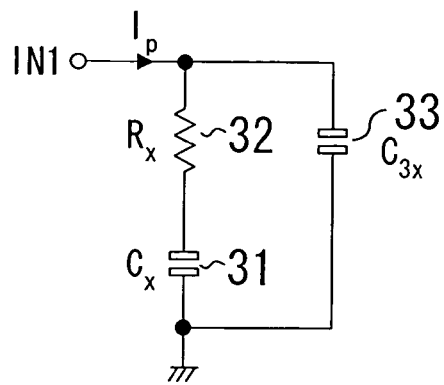
FIG. 2 illustrates the process of conversion from a general passive filter to a loop filter according to embodiment 1 of the present invention.
Figure 2:
Figure 2:
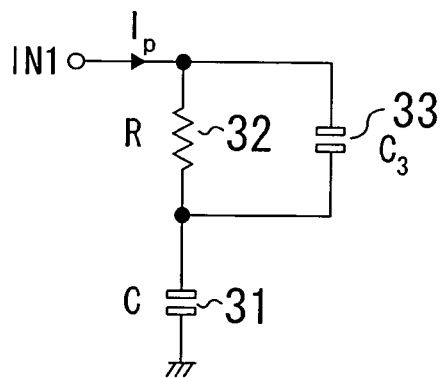
Figure 2:
Figure 2:
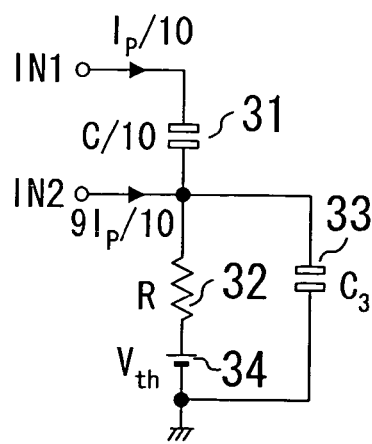
Figure 15A:
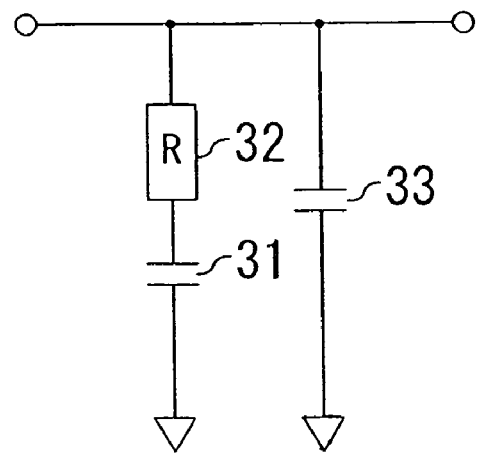
FIGS. 15A and 15B are circuit diagrams of a general loop filter.
Figure 15B:
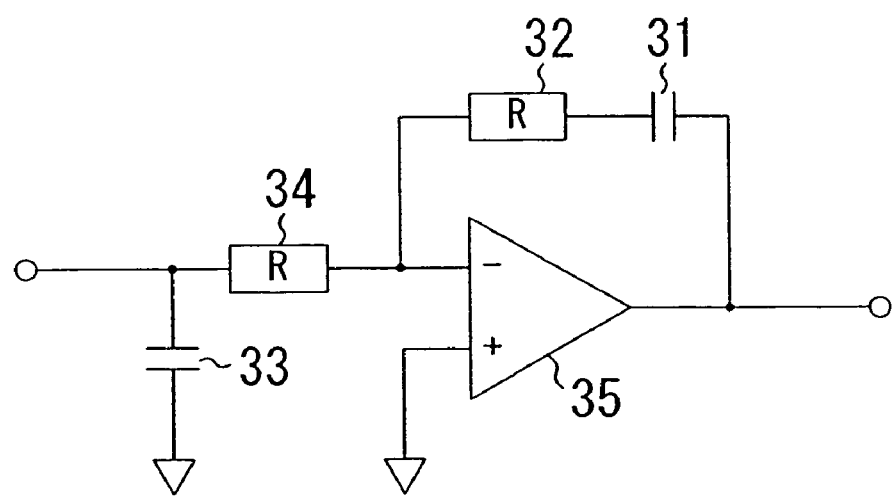
Figure 16:
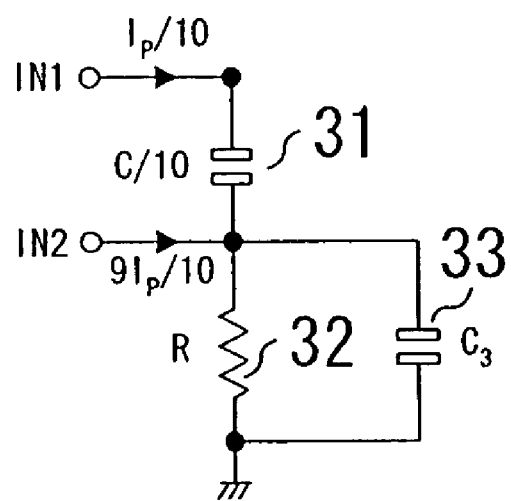
FIG. 16 is a circuit diagram of a loop filter disclosed in Japanese Patent Application No 2003-121647.

Now, a method for converting a general passive filter to a loop filter according to embodiment 1 is described with reference to FIG. 2. A passive filter shown in part (a) of FIG. 2 is the same as the passive filter shown in FIG. 15A. In this passive filter, respective element values are converted according to Expressions (1) to (3):

$$C = C_{3X} + C_X \qquad (1)$$

$$C_3 = (C_{3X} + C_X)\frac{C_{3X}}{C_X} \qquad (2)$$

$$R = \frac{R_X C_X^2}{(C_{3X} + C_X)^2} \qquad (3)$$

where $C_x$ is the capacitance value of the capacitive element 31, $R_x$ is the resistance value of the resistive element 32, and $C_{3x}$ is the capacitance value of the capacitive element 33. As a result of this conversion, the passive filter shown in part (b) of FIG. 2 is obtained. In the passive filter of part (b), input terminal IN1 and the ground are replaced with each other, and input terminal IN2 is provided between the capacitive element 31 and the resistive element 32, such that electric current Ip/10 and 9Ip/10 are supplied to input terminals IN1 and IN2, respectively. As a result, a passive filter shown in part (c) of FIG. 2 wherein the capacitive element 31 is reduced to a 1/10 of the conventional element, i.e., the loop filter 30A of embodiment 1, is obtained.

Returning to FIG. 1, in the loop filter 30A of embodiment 1, the power supply 34 of voltage Vth is connected in series to the resistive element 32. Voltage Vth is the threshold voltage of a MOS transistor. That is, the voltage of input terminal IN2 is always equal to or higher than the threshold voltage of the MOS transistor which constitutes the control switch SW2, and therefore, the charge pump circuit 20A stably supplies constant electric current αIp to input terminal IN2. The voltage equal to or higher than voltage Vth is always applied between the ends of the capacitive element 33. Thus, the capacitance value of the MOS capacitor is increased, and the capacitive element 33 stably functions as a capacitor.

Figure 3:
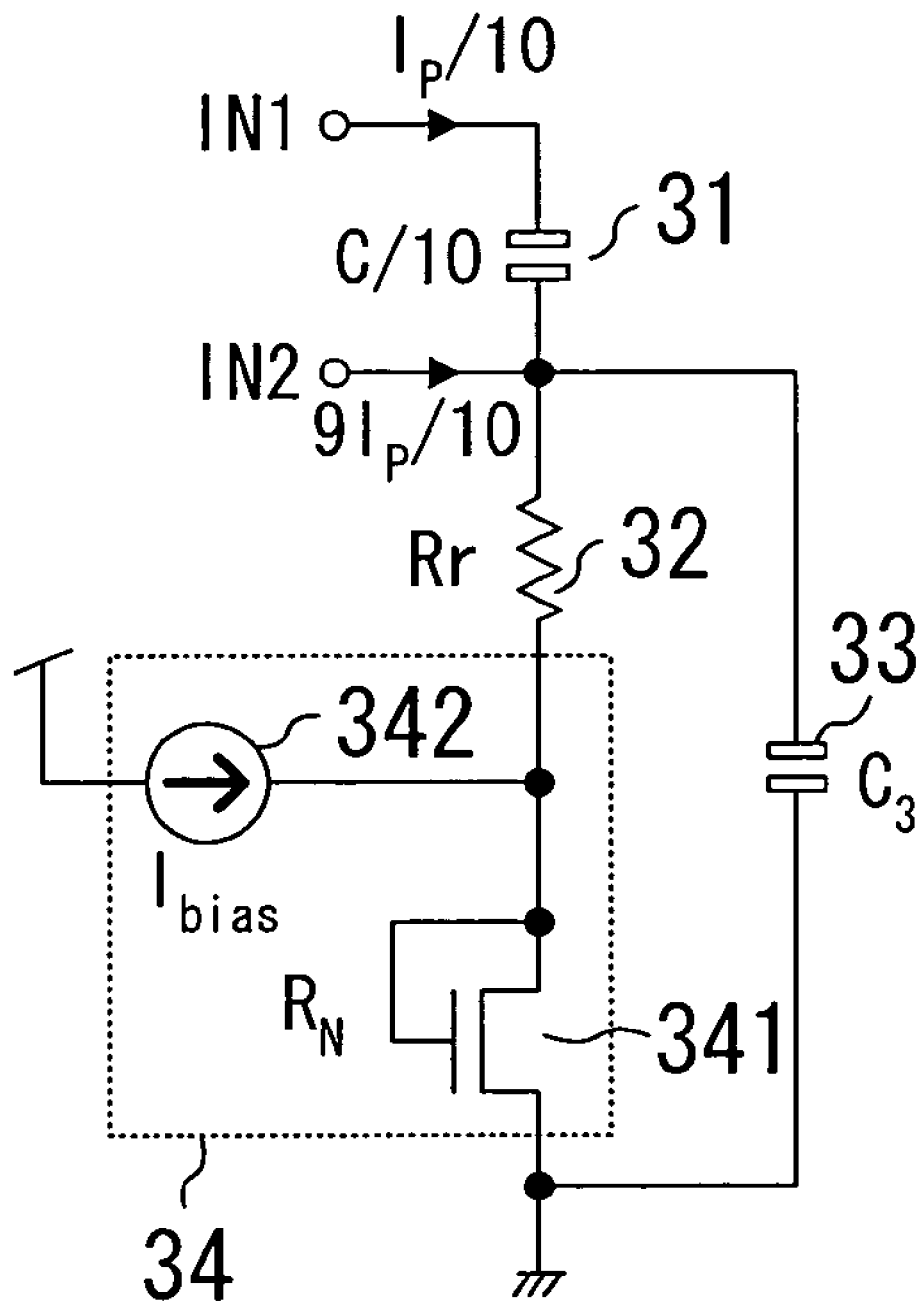
FIG. 3 is a specific circuit diagram of a power supply in the loop filter according to embodiment 1 of the present invention.

FIG. 3 shows a specific circuit structure of the power supply 34. The power supply 34 includes a diode-connected NMOS transistor 341 and an electric current source 342 for supplying bias current $I_{bias}$ to the NMOS transistor 341. Herein, a resistive element or any other resistive impedance component may be used in place of the NMOS transistor 341. However, the internal resistance value of the power supply 34, i.e., the combined resistance value of resistance value $R_N$ of the NMOS transistor 341 and resistance value $R_r$ of the resistive element 32 shown in FIG. 3, is set to a value equal to resistance value R of the resistive element 32 shown in part (c) of FIG. 2. Thus, the resistive element 32 can be omitted by setting the resistance value of the NMOS transistor 341 to a value equal to resistance value R.

Figure 4A:
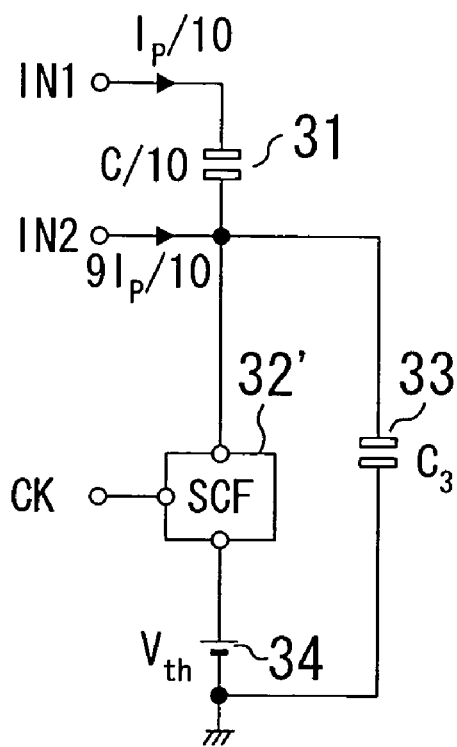
FIG. 4A is a circuit diagram of the loop filter of embodiment 1 of the present invention wherein a switched-capacitor circuit is used in place of the resistive element.
Figure 4B:
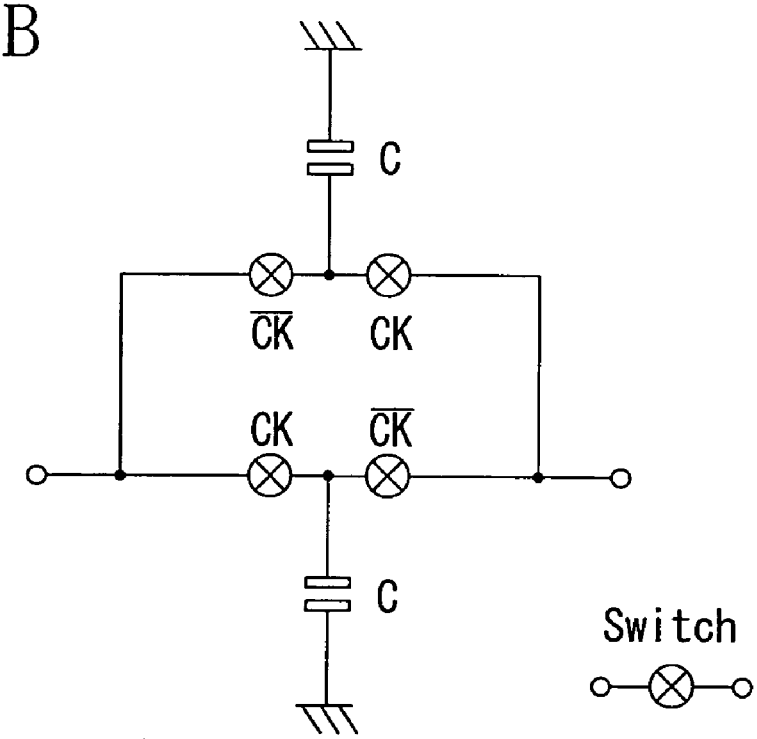
FIG. 4B shows an example of the switched-capacitor circuit.

The resistive element 32 may be formed by a switched-capacitor circuit. FIG. 4A shows a low-pass filter obtained by replacing the resistive element 32 of the circuit shown in part (c) of FIG. 2 with a switched-capacitor circuit (SCF circuit). As well known in the art, a switched-capacitor circuit is a circuit which samples the capacitance to perform charge transfer and whose function is equivalent to a resistor. FIG. 4B shows an example of the structure of a switched-capacitor circuit 32'. Each switch of the switched-capacitor circuit 32' opens/closes according to clock CK and clock/CK that is the inverse of clock CK. The switched-capacitor circuit 32' functions as a resistor having a resistance value of 1/(2Cf), where C is the capacitance value of the switched-capacitor circuit 32', and f is the frequency of clock CK, i.e., the sampling frequency. It should be noted that, for example, input clock CKin or output clock CKout of the PLL of embodiment 1 may be used as clock CK.

As described above, according to embodiment 1, the loop filter 30A receives two lines of electric currents, whereby the size of the capacitive element 31 is decreased. In the loop filter 30A having such a structure, the voltage of input terminal IN2 is secured such that control switch SW2 of the charge pump circuit 20A can operate. As a result, a constant electric current is accurately output from/input to the loop filter 30A, whereby a stable and accurate filtering operation is realized. Further, since the voltage between the ends of the capacitive element 33 is secured, the capacitive element 33 can be replaced by a MOS capacitor. Furthermore, the electric current value supplied to input terminal IN1 is reduced, whereby the size of the capacitive element 31 is further decreased.

In the above description, voltage Vth of the power supply 34 is the threshold voltage of a MOS transistor, but the present invention is not limited thereto. Voltage Vth may be at a level such that the constancy of the electric current in the charge pump circuit 20A is secured.

The order of connection of the power supply 34 and the resistive element 32 may be inverted. That is, a structure may be employed wherein the positive terminal of the power supply 34 is connected to input terminal IN2 and the capacitive element 33, and the ground potential is supplied to one end of the resistive element 32.

(Embodiment 2)

In the loop filter 30A of embodiment 1, the capacitive element 31 and the capacitive element 33 are connected in series. Thus, the voltage at input terminal IN1 is divided and applied to the capacitive elements 31 and 33. Therefore, if the voltage Vth of the power supply 34 increased too high, the voltage applied between the ends of the capacitive element 31 is relatively decreased. Then, if the decreased voltage is lower than the threshold voltage of a MOS transistor, it is difficult to use a MOS capacitor for the capacitive element 31. In view of such, now consider a loop filter having filter characteristics equivalent to that of a conventional filter, wherein the capacitive element 31 and the capacitive element 33 are connected in parallel.

Figure 5:
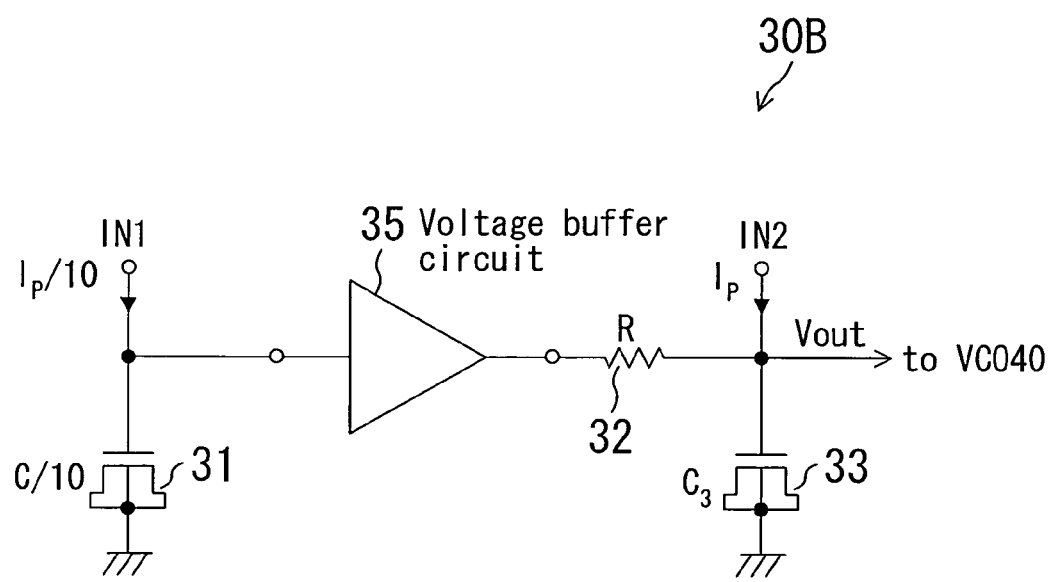
FIG. 5 shows the structure of a loop filter according to embodiment 2 of the present invention.

FIG. 5 shows the structure of a loop filter according to embodiment 2 of the present invention. The loop filter 30B of embodiment 2 includes a capacitive element (first capacitive element block) 31, a resistive element 32 and a voltage buffer circuit 35 which are connected in series and constitute a second element block, and a capacitive element (third element block) 33. One end of the capacitive element 31 is supplied with the ground potential (first voltage), and the other end is connected to input terminal IN1 and the input side of the voltage buffer circuit 35. The output side of the voltage buffer circuit 35 is connected to the resistive element 32. One end of the capacitive element 33 is connected to input terminal IN2 and the resistive element 32, and the other end is supplied with the ground potential (second voltage). The loop filter 30B outputs voltage Vout generated at a connection point between the resistive element 32 and the capacitive element 33. That is, the loop filter 30B substantially outputs the sum of the voltage generated in the capacitive element 31 and the voltage generated in the capacitive element 33. The capacitive elements 31 and 33 are MOS capacitors, each of which is formed by an NMOS transistor.

The loop filter 30B can replace the loop filter 30A in the PLL shown in FIG. 1. In this case, the loop filter 30B inputs, for example, electric currents Ip/10 and Ip from the charge pump circuit 20A to input terminals IN1 and IN2, respectively. Voltage Vout generated at the connection point between the resistive element 32 and the capacitive element 33 is output to a voltage controlled oscillator 40. That is, a relatively small electric current is supplied to the capacitive element 31, whereby the capacitance value of the capacitive element 31 is decreased.

Next, it is explained that the loop filter 30B of embodiment 2 exhibits a transfer characteristic equivalent to that of a general passive filter. The transfer function of the passive filter shown in part (a) of FIG. 2 is:

$$Vout/I_{PX} = \frac{\left(1 + \frac{C_{3X}}{C_X}\right)(sC_X R_X + 1)}{sC_X\left(\frac{sR_X C_{3X} C_X}{C_{3X} + C_X}\right) + 1} \quad (4)$$

where $I_{PX}$ is the input current, and Vout is the voltage output from the connection point between the resistive element 32 and the capacitive element 33. On the other hand, the transfer function of the loop filter 30B is:

$$Vout/I_P = \frac{sCR + 1}{sC(sC_3 R + 1)} \quad (5)$$

Each element value is converted according to conversion expressions (6) to (9) shown below, whereby expression (4) is equivalent to expression (5).

$$R = R_X \quad (6)$$

$$C = C_X \quad (7)$$

$$C_3 = \frac{C_{3X} C_X}{C_{3X} + C_X} \quad (8)$$

$$I_P = \left(1 + \frac{C_{3X}}{C_X}\right) I_{PX} \quad (9)$$

Figure 6:
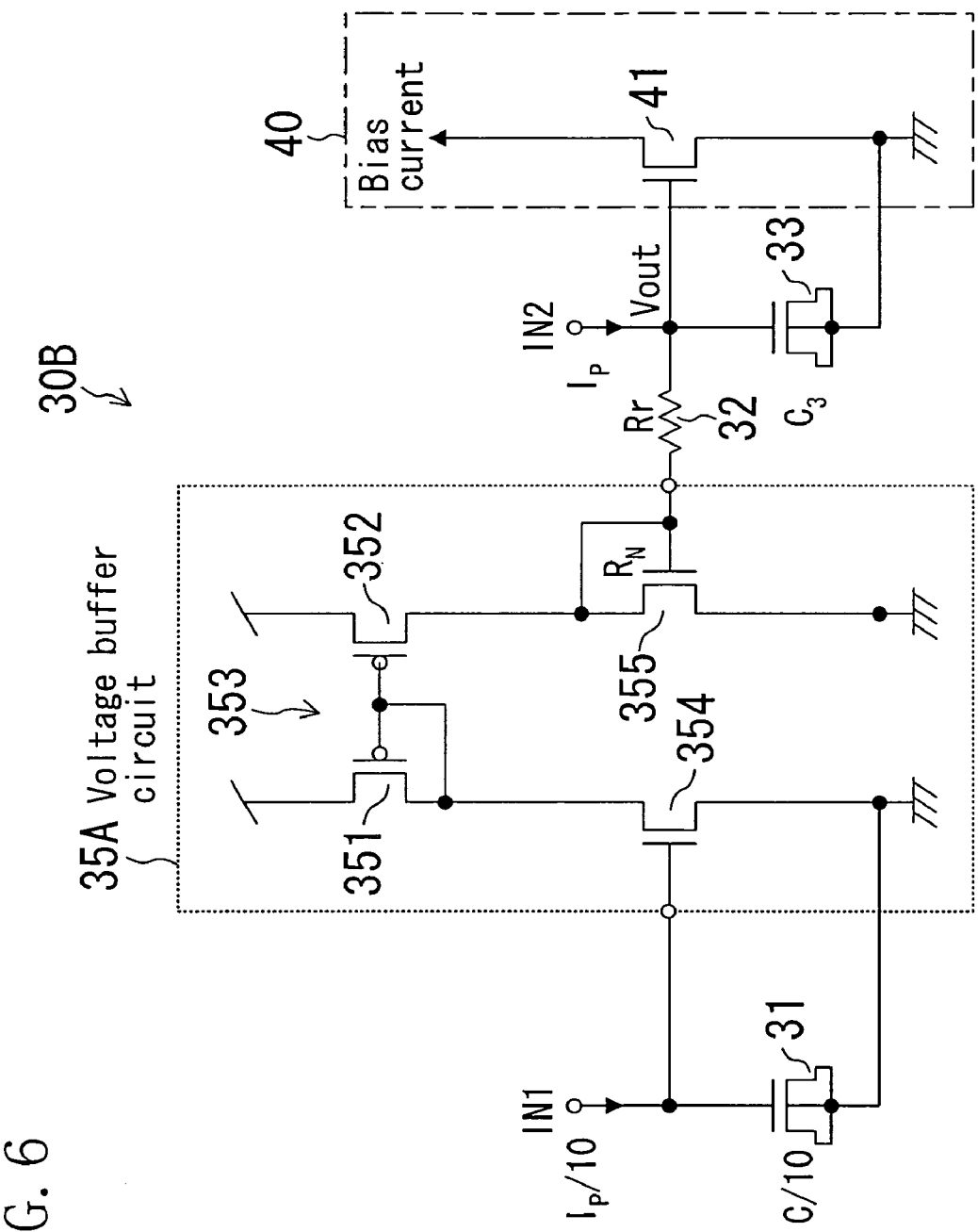
FIG. 6 is a specific circuit diagram of a voltage buffer circuit in the loop filter according to embodiment 2 of the present invention.

FIG. 6 shows a specific circuit structure of the voltage buffer circuit 35. A voltage buffer circuit 35A includes a current mirror circuit 353, which is formed by PMOS transistors 351 and 352, an NMOS transistor 354 for generating an electric current which is to be supplied to the input side of the current mirror circuit 353, and a diode-connected NMOS transistor 355 which receives the output current of the current minor circuit 353. The voltage buffer circuit 35A receives the voltage generated in the capacitive element 31 at the gate electrode of the NMOS transistor 354 and outputs the voltage generated in the NMOS transistor 355. Herein, the transconductances of the NMOS transistors 354 and 355 are set to the same value (arbitrary value), and the transconductances of the PMOS transistors 351 and 352 are set to the same value (arbitrary value), whereby the AC voltage gain is substantially "1". That is, the voltage buffer circuit 35A functions as the voltage buffer.

Herein, a resistive element or any other resistive impedance component may be used in place of the NMOS transistor 355. However, the internal resistance value of the voltage buffer circuit 35A, i.e., the combined resistance value of resistance value $R_N$ of the NMOS transistor 355 and resistance value $R_r$ of the resistive element 32 shown in FIG. 6, is set to a value equal to resistance value R of the resistive element 32 shown in FIG. 5. Thus, the resistive element 32 can be omitted by setting the resistance value of the NMOS transistor 355 to a value equal to resistance value R.

In the loop filter 30B having the structure shown in FIG. 6, voltage Vout is input to the voltage controlled oscillator 40, and an NMOS transistor 41 generates a bias current in the voltage controlled oscillator 40. When a PMOS transistor is used as a transistor for generating the bias current, the loop filter 30B has the structure described below.

Figure 7:
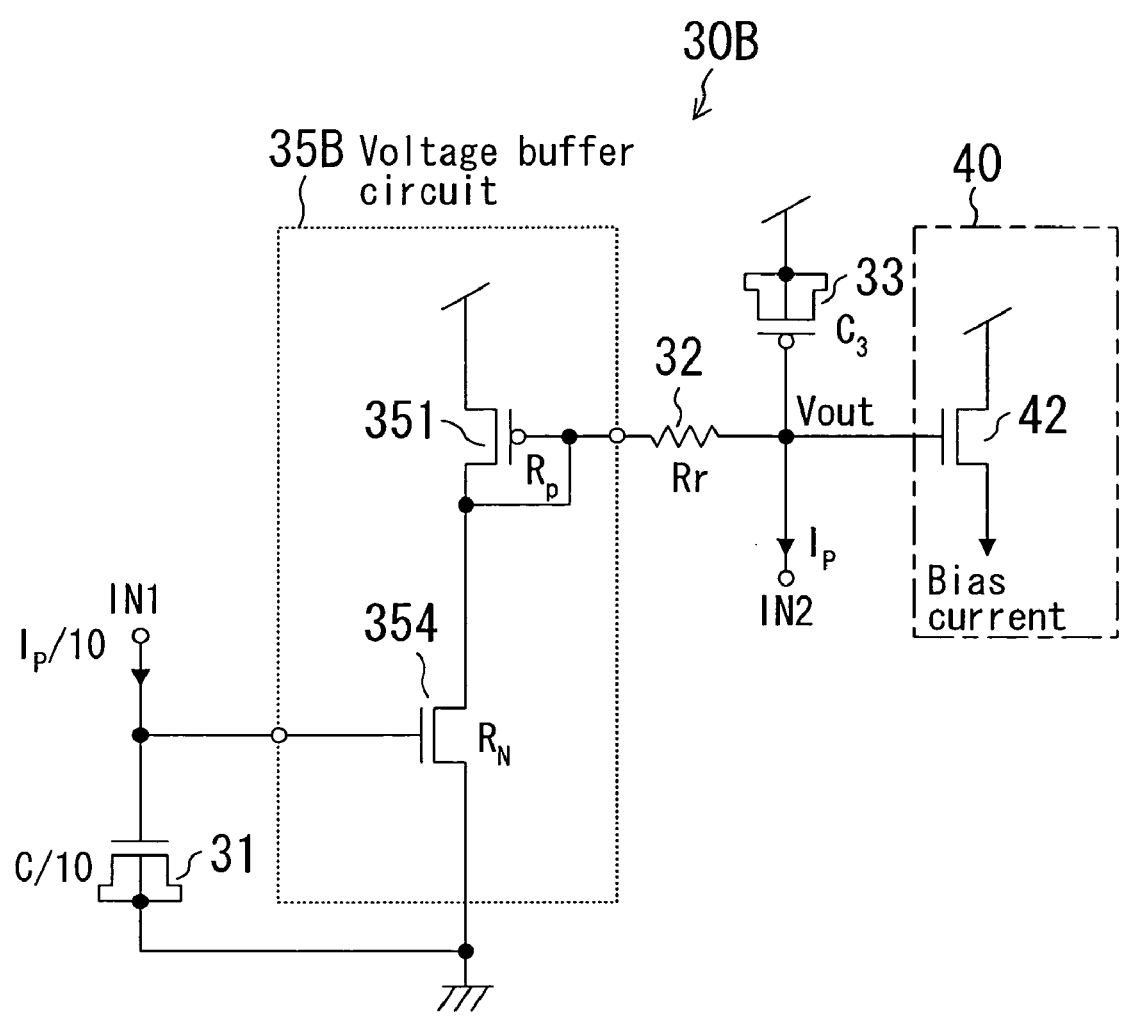
FIG. 7 is another specific circuit diagram of the voltage buffer circuit in the loop filter according to embodiment 2 of the present invention.

FIG. 7 shows another specific circuit structure of the voltage buffer circuit 35. A voltage buffer circuit 35B shown in FIG. 7 is obtained by omitting the PMOS transistor 352 and the NMOS transistor 355 from the voltage buffer circuit 35A shown in FIG. 6. The voltage buffer circuit 35B receives the voltage generated in the capacitive element 31 at the gate electrode of the NMOS transistor 354 and outputs the voltage generated in the PMOS transistor 351. Herein, the transconductances of the PMOS transistor 351 and the NMOS transistor 354 are set such that the AC voltage gain of the voltage buffer circuit 35B is substantially "1", whereby the voltage buffer circuit 35A functions as a voltage buffer.

In the structure shown in FIG. 7, the capacitive element 33 is formed by a PMOS transistor which is connected to a supply voltage (second voltage). The direction of electric current Ip supplied to input terminal IN2 is opposite to that of electric current Ip/10 which is supplied to input terminal IN1. Voltage Vout is input to the voltage controlled oscillator 40, and a PMOS transistor 42 generates a bias current in the voltage controlled oscillator 40.

Figure 8:
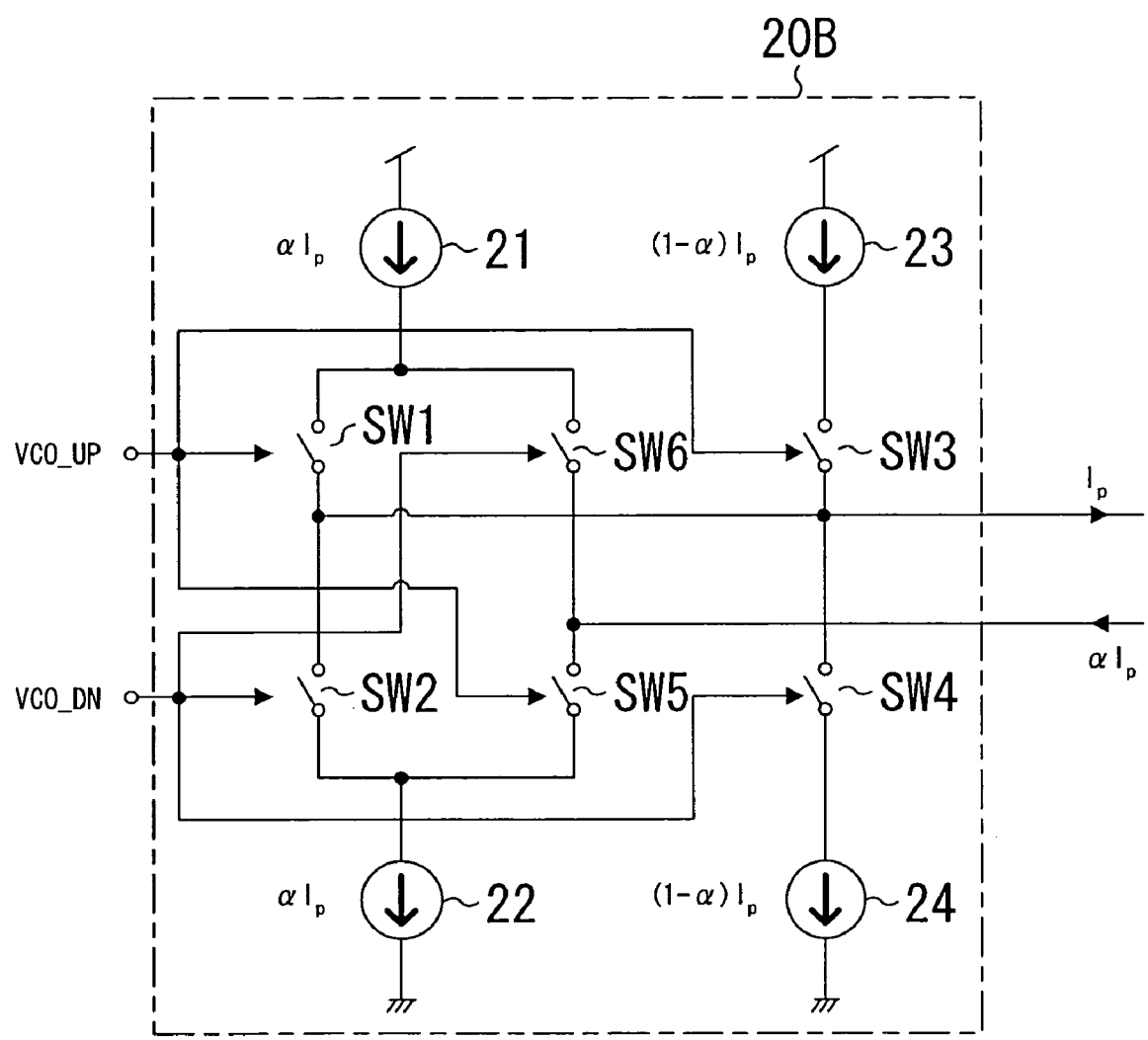
FIG. 8 is a circuit diagram of a charge pump circuit for the loop filter shown in FIG. 7.

FIG. 8 shows a charge pump circuit for the loop filter 30B shown in FIG. 7. The charge pump circuit 20B includes electric current sources 21, 22, 23 and 24. However, the electric current sources 21 and 23 merely resulted from dividing a conventional current source which supplies electric current Ip with the ratio of α:(1−α). This also applies to the electric current sources 22 and 24. When signal UP is supplied, control switches SW1, SW3 and SW5 are brought into conduction, so that electric current Ip, which is the sum of the electric currents supplied from the electric current sources 21 and 23, is released from the charge pump circuit 20B, and electric current αIp is sucked into the charge pump circuit 20B. On the other hand, when signal DN is supplied, control switches SW2, SW4 and SW6 are brought into conduction, so that electric current Ip, which is the sum of the electric currents supplied from the electric current sources 22 and 24, is sucked into the charge pump circuit 20B, and electric current alp is released from the charge pump circuit 20B.

The transfer function of the loop filter 30B shown in FIG. 7 is:

$$Vout/I_P = \frac{R_P\{sCR_N\left(1 + \frac{R_r}{R_P}\right) + 1\}}{sCR_N\{sC_3(R_P + R_r) + 1\}} \quad (10)$$

Each element value is converted according to conversion expressions (11) and (12) shown below, whereby expression (10) is equivalent to expression (5). Thus, expression (10) is equivalent to expression (4).

$$R_P = R_N \quad (11)$$

$$R = R_P + R_r \quad (12)$$

Herein, a resistive element or any other resistive impedance component may be used in place of the PMOS transistor 341. However, the internal resistance value of the voltage buffer circuit 35A, i.e., the combined resistance value of resistance value $R_P$ of the PMOS transistor 351 and resistance value $R_r$ of the resistive element 32 shown in FIG. 6, is set to a value equal to resistance value R of the resistive element 32 shown in FIG. 5. Thus, the resistive element 32 can be omitted by setting the resistance value of the PMOS transistor 351 to a value equal to resistance value R.

As described above, according to embodiment 2, the capacitive element 31 and the capacitive element 33 are connected in parallel, and therefore, a sufficiently large voltage is readily applied to these elements. Thus, a MOS capacitor is readily used for the capacitive elements 31 and 33. Furthermore, the size of the capacitive element 31 is further decreased by reducing the value of the electric current supplied to input terminal IN1.

The resistive element 32 of the loop filter 30B may be formed by a switched-capacitor circuit as in embodiment 1.

As a matter of course, the capacitive elements 31 and 33 may be formed by, for example, a capacitance between wires in place of the MOS capacitors.

(Embodiment 3)

In the circuit structure described in embodiment 2, if sufficient linearity is secured between the output voltage Vout of the loop filter 30B and the oscillation frequency of the voltage controlled oscillator 40, and it is not necessary to largely change the oscillation frequency of the voltage controlled oscillator 40, a power supply which outputs a predetermined voltage may be connected to the resistive element 32 in place of the voltage buffer circuit 35. Hereinafter, a loop filter having a structure wherein the voltage buffer circuit 35 in the loop filter 30B is replaced with a power supply is described.

Figure 9:
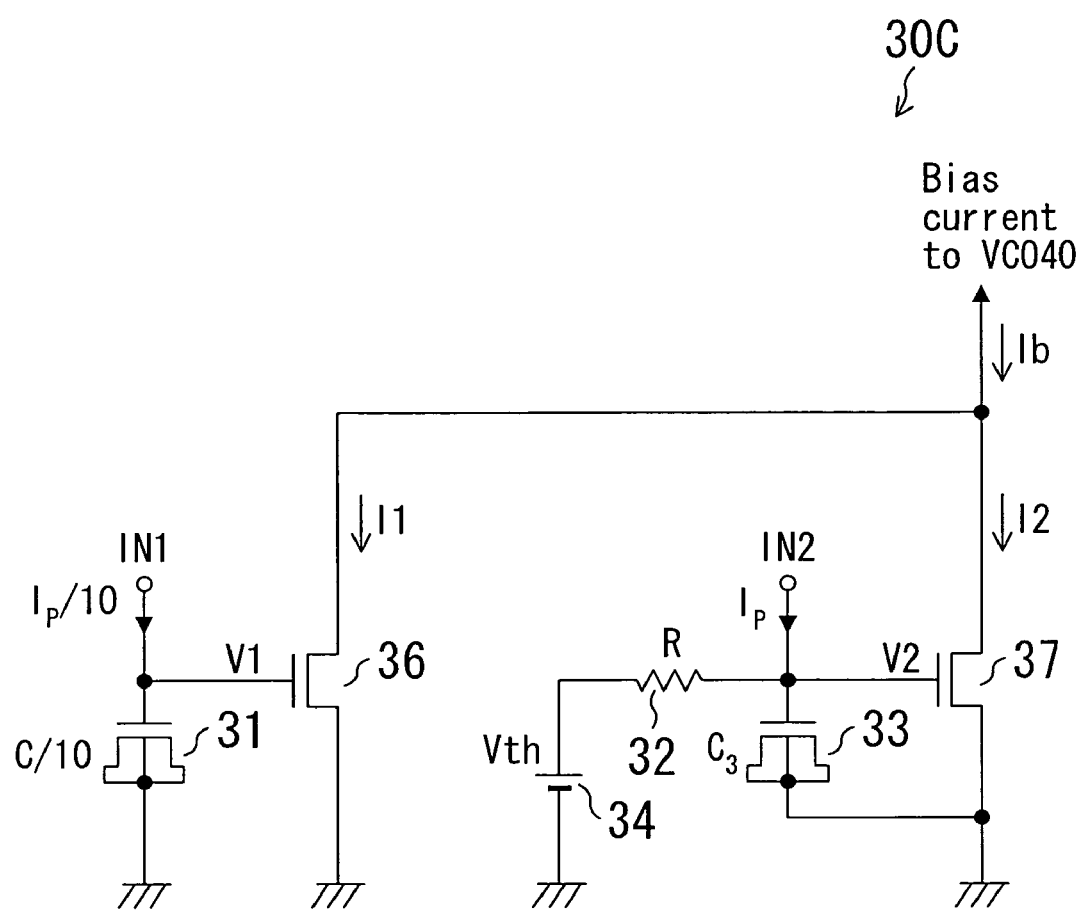
FIG. 9 shows the structure of a loop filter according to embodiment 3 of the present invention.

FIG. 9 shows the structure of a loop filter according to embodiment 3 of the present invention. The loop filter 30C of embodiment 3 includes a capacitive element (first element block) 31, a resistive element 32 and a power supply 34 which are connected in series and constitute the second element block, a capacitive element (third element block) 33, an NMOS transistor (first voltage-current conversion circuit) 36, and an NMOS transistor (second voltage-current conversion circuit) 37. One end of the capacitive element 31 is supplied with the ground potential (first voltage), and the other end is connected to input terminal IN1 and the gate electrode of the NMOS transistor 36. The negative terminal of the power supply 34 is supplied with the ground potential (second voltage), and the positive terminal is connected to the resistive element 32. The capacitive element 33 is connected in parallel to the resistive element 32 and the power supply 34 which are connected in series. Input terminal IN2 is connected to a connection point between the resistive element 32 and the capacitive element 33. It should be noted that the capacitive elements 31 and 33 are MOS capacitors, each of which is formed by an NMOS transistor.

Voltage Vth of the power supply 34 is as described in embodiment 1, and therefore, the description thereof is herein omitted.

The NMOS transistor 36 receives at the gate voltage V1 generated in the capacitive element 31 and allows electric current I1 that is determined according to voltage V1 to flow through the source and drain. The NMOS transistor 37 receives at the gate voltage V2 generated in the capacitive element 33 and allows electric current I2 that is determined according to voltage V2 to flow through the source and drain. Then, electric current Ib obtained by combining electric current I1 and electric current I2 is supplied to the voltage controlled oscillator 40 as the bias current. In this way, the voltages generated in the capacitive elements 31 and 33 are converted to electric currents, and the electric currents are combined, whereby the transfer characteristic equivalent to that of embodiment 2 is readily achieved.

Explaining from a different point of view, it can be said that the loop filter 30C of embodiment 3 is equivalent to the structure wherein the block including the capacitive element 31 of the loop filter 30A of embodiment 1 and the block including the resistive element 32, the power supply 34 and the capacitive element 33 are connected in parallel. The loop filter 30C converts voltages V1 and V2 to electric currents I1 and I2, respectively, and outputs the sum of electric currents I1 and I2, instead of outputting the sum of voltages V1 and V2 generated in the above blocks.

As described above, according to embodiment 3, the capacitive element 31 and the capacitive element 33 are connected in parallel, and therefore, a sufficiently large voltage is readily applied to these elements. Thus, MOS capacitors are readily used for the capacitive elements 31 and 33. Furthermore, the size of the capacitive element 31 is further decreased by reducing the value of the electric current supplied to input terminal IN1.

The resistive element 32 of the loop filter 30C may be formed by a switched-capacitor circuit as in embodiment 1.

As a matter of course, the capacitive elements 31 and 33 may be formed by, for example, a capacitance between wires in place of the MOS capacitors.

In embodiments 1–3, a PLL is considered as the feedback system, but the present invention is not limited thereto. For example, in the structure of FIG. 1, the frequency divider 50 is omitted, and the voltage controlled oscillator 40 is replaced with a voltage controlled delay circuit (output clock generation means), whereby a delay locked loop circuit (hereinafter, referred to as "DLL") may be structured.

(Applications of the Feedback System of the Present Invention)

A PLL or DLL of the present invention does not require a large capacitive element, and therefore, the circuit size thereof is reduced. Further, a MOS capacitor is readily used. Thus, applications to the products described below are especially expected.

Figure 10:
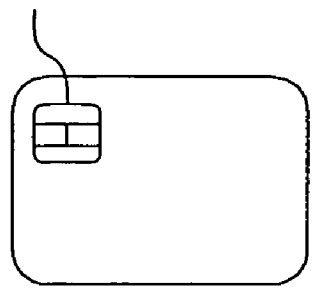
FIG. 10 shows an application of a PLL or DLL of the present invention to an IC card.

FIG. 10 is an example of an LSI device for an IC card, which incorporates a PLL or DLL of the present invention. An LSI device used for IC cards has a limited installation area, and therefore, the PLL or DLL of the present invention which can be structured with a smaller circuit area is especially suitable for use in an IC card.

Figure 11:
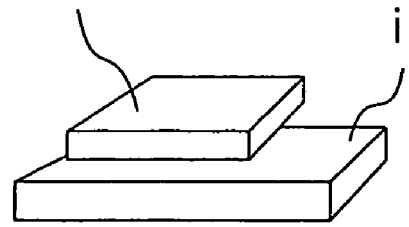
FIG. 11 shows an application of a PLL or DLL of the present invention to a COC component.

FIG. 11 shows an application of the PLL or DLL of the present invention to a chip-on-chip (COC) component. In a chip-on-chip structure, the circuit area of a semiconductor integrated circuit of the upper layer is limited, and therefore, the PLL or DLL of the present invention is effective in such a case.

Figure 12:
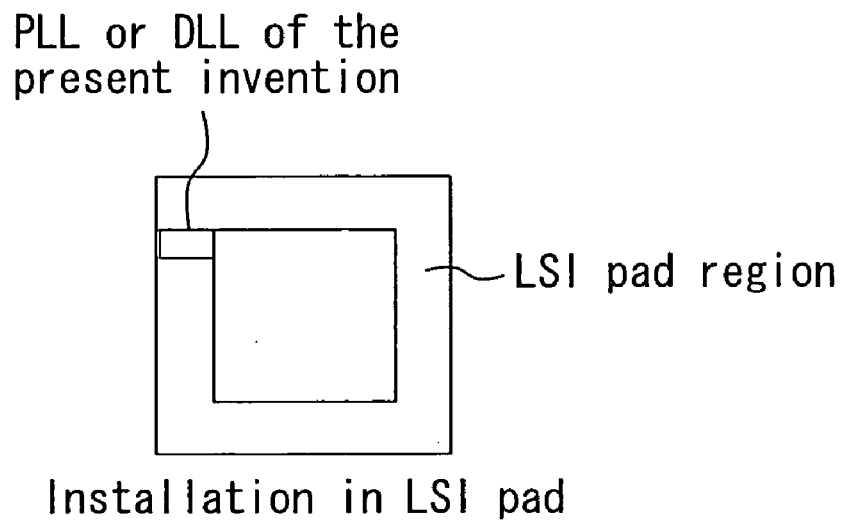
FIG. 12 shows an example of installation of a PLL or DLL of the present invention in an LSI pad region.

FIG. 12 shows an application of the PLL or DLL of the present invention to an LSI pad region. The circuit area available for installation is also limited as described above as to the chip-on-chip structure. Therefore, the PLL or DLL of the present invention is accordingly effective in such a case.

Figure 13:
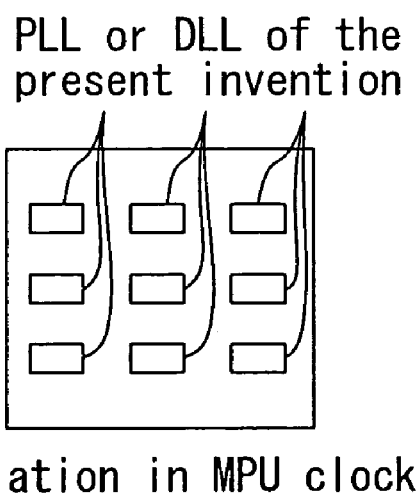
FIG. 13 shows an example of installation of a PLL or DLL of the present invention in a microprocessor.
Figure 14:
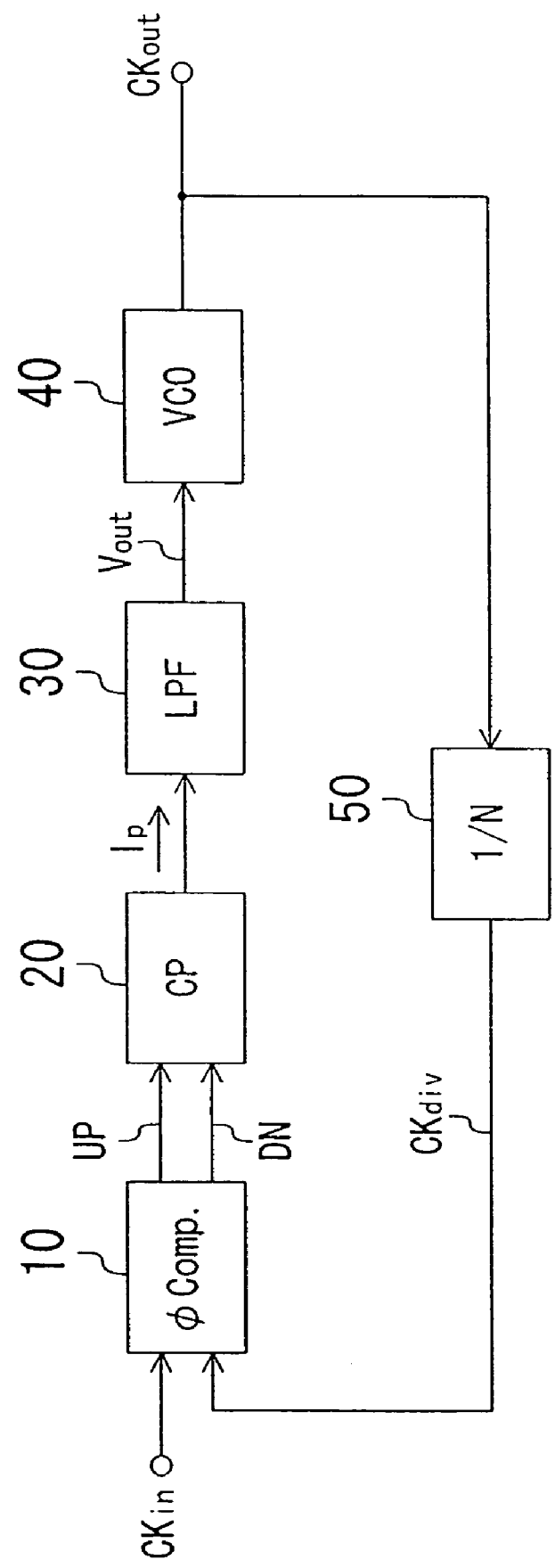
FIG. 14 shows the structure of a general charge pump PLL.

FIG. 13 is an example of the PLLs or DLLs of the present invention which are installed as clock generation means in a microprocessor. In currently-existing microprocessors, a large number of PLLs or DLLs are incorporated. Therefore, using the PLLs or DLLs of the present invention in a microprocessor raises the expectation that the entire circuit area of the microprocessor is greatly reduced. Thus, the effects obtained by applying the PLLs or DLLs of the present invention to a microprocessor are significantly large.

As described above, according to the present invention, a low-pass filter which has filter characteristics equal to those of a conventional low-pass filter, which is formed by a small-sized capacitive element, and which operates stably is realized. Furthermore, a sufficient voltage is applied to the capacitive element, and accordingly, the MOS capacitor is readily used.

Especially when a low-pass filter of the present invention is used as a loop filter in a feedback system, such as a PLL, or the like, the size of a capacitive element in a loop filter is decreased. Furthermore, since the MOS capacitor is used without introducing any disadvantage, it is not necessary to provide a capacitance process in a manufacturing process of a digital circuit having a feedback system. As a result, the effects of decreasing the size of the feedback system and the production cost are achieved.

What is claimed is:

1. A low-pass filter, comprising:
   a first element block having a first capacitive element;
   a second element block having a resistive element and a power supply connected in series to the resistive element, one end of the second element block being connected to one end of the first element block, the other end of the second element block being supplied with a reference voltage;
   a third element block having a second capacitive element, the third element block being connected in parallel to the second element block;
   a first input terminal for receiving a first electric current, the first input terminal being connected to the other end of the first element block; and
   a second input terminal for receiving a second electric current, the second input terminal being connected to a connection point of the first to third element blocks, the direction of the second electric current being the same as that of the first electric current, the magnitude of the second electric current being N times that of the first electric current (where N is a predetermined number),
   wherein the low-pass filter outputs a voltage generated at the one end of the first element block.

2. A low-pass filter, comprising:
   a first element block having a first capacitive element, one end of the first element block being supplied with a first voltage;
   a second element block having a resistive element and a power supply connected in series to the resistive element, one end of the second element block being supplied with a second voltage;
   a third element block having a second capacitive element, the third element block being connected in parallel to the second element block;
   a first voltage-current conversion circuit for converting a voltage generated at the other end of the first element block to an electric current;
   a second voltage-current conversion circuit for converting a voltage generated at the other end of the second element block to an electric current;
   a first input terminal for receiving a first electric current, the first input terminal being connected to the other end of the first element block; and
   a second input terminal for receiving a second electric current, the second input terminal being connected to a connection point of the second and third element blocks, the magnitude of the second electric current being N times that of the first electric current (where N is a predetermined number),
   wherein the low-pass filter outputs a sum of the electric currents generated by the first and second voltage-current conversion circuits.

3. The low-pass filter of claim 1 or 2, wherein the resistive element of the second element block is an internal resistor of the power supply.

4. The low-pass filter of any one of claims 1 or 2, wherein the resistive element of the second element block is a switched-capacitor circuit.

5. The low-pass filter of claim 2, wherein both the first and second capacitive elements are MOS capacitors.

6. A feedback system for feeding back an output clock generated based on an input clock such that the output clock has a predetermined characteristic, comprising:
   a loop filter formed by a low-pass filter recited in any one of claims 1 or 2;
   a charge pump circuit for generating the first and second electric currents which are to be input to the loop filter based on a phase difference between the input clock and the fed-back clock; and
   output clock generation means for generating the output clock based on an output signal from the loop filter.

* * * * *